(12) United States Patent
Matsuzawa

(10) Patent No.: US 6,515,497 B1
(45) Date of Patent: Feb. 4, 2003

(54) AIR PUMP OPERATED TEST FIXTURE AND METHOD FOR TESTING A CIRCUIT BOARD

(75) Inventor: Hajime Matsuzawa, Tokyo (JP)

(73) Assignee: NEC Corporation, Tokyo (JP)

( * ) Notice: Subject to any disclaimer, the term of this patent is extended or adjusted under 35 U.S.C. 154(b) by 30 days.

(21) Appl. No.: 09/696,244

(22) Filed: Oct. 26, 2000

(30) Foreign Application Priority Data

Dec. 9, 1999 (JP) .................................. 11-350451

(51) Int. Cl.⁷ .................................. G01R 31/02
(52) U.S. Cl. .................................. 324/755; 324/761
(58) Field of Search .................................. 324/754, 755, 324/758, 72.5, 761, 762

(56) References Cited

U.S. PATENT DOCUMENTS

| | | | | |
|---|---|---|---|---|
| 2,954,521 A | * | 9/1960 | McKee | 324/72.5 |
| 3,714,572 A | * | 1/1973 | Ham et al. | 324/758 |
| 4,138,643 A | * | 2/1979 | Beck et al. | 324/72.5 |
| 5,124,646 A | * | 6/1992 | Shiraishi | 439/482 |

FOREIGN PATENT DOCUMENTS

| | | |
|---|---|---|
| JP | 62-245975 | 10/1987 |
| JP | 10-153622 | 6/1998 |

* cited by examiner

Primary Examiner—Vinh P. Nguyen
(74) Attorney, Agent, or Firm—Young & Thompson

(57) ABSTRACT

A circuit board test fixture includes probe pins that contact connection terminals of the board. The probe pins are electrically connected without applying a force directly to the board by placing the probe pins in sleeves and by sliding the probe pins into contact with connection terminals with air pressure.

8 Claims, 5 Drawing Sheets

AIR PUMP OPERATED TEST FIXTURE AND METHOD FOR TESTING A CIRCUIT BOARD

BACKGROUND OF THE INVENTION

1. Field of the Invention

The present invention relates to a test fixture for electrically connecting an in-circuit tester (print-wiring board tester) and a loaded board.

2. Description of the Related Art

Heretofore, as a fixture used for a tester, such as an in-circuit tester, a probe pin and a spring are combined to form a spring probe pin.

Referring to FIG. 10, the conventional fixture 41 is constituted by having spring probe pins 42, sleeves 43, a top plate 44, a base 45, a support stage 46 and springs 47. The spring probe pins 42 are electrically connected to the sleeves 43. Also, the sleeves 43 are respectively connected through wirings 48 to a tester 49.

In this conventional fixture 41, a loaded board 11 is arranged on the support stage 46. Then, relative to the loaded board 11, a force is applied from the upper surface of the loaded board 11 in the arrow direction (downward). The springs 47 arranged under the support stage 46 are compressed, and the loaded board 11 is pressed relative to the top plate 44. In a short time, connection terminals 13 of the loaded board 11 contact the spring probe pins 42, and the fixture 41 and the loaded board 11 are electrically connected. At this time, the spring probe pins 42 absorb a pressing force from the loaded board 11 by compressing its spring inside the sleeves 43.

Alternatively, referring to FIG. 11, this conventional fixture 51 includes spring probe pins 52, sleeves 53, a top plate 54, a base 55, a support stage 56, springs 57 and an air hole 59 as an air gateway. The springs 57 support the loaded board 11 and the support stage 56. The spring probe pins 52 are electrically connected to the sleeves 53. Moreover, the sleeves 53 are connected through the wirings 58 to the tester 60. Furthermore, to the air hole 59, a suction pump 61 for evacuating air inside the fixture 51 is connected.

In this conventional fixture 51, the loaded board 11 is arranged on the support stage 56. When the loaded board 11 is arranged on the support stage 56, a closed space, which is surrounded by the sleeves 53, the top plate 54, the base 55 and the loaded board 11, is made on the upper surface of the fixture 51. Then, by the suction pump 61, the air in the closed space is evacuated through the air hole 59. As the suction pump 61 evacuates the air in the closed space made on the upper surface of the fixture 51, the closed space gradually falls into a vacuum state. As the closed space falls into a vacuum state, the springs 57 are compressed, and the loaded board 11 is drawn to the top plate 54. The connection terminals 13 of the loaded board 11 contact the spring probe pins 53 as shown in FIG. 12. The loaded board 11 and the fixture 51 are electrically connected.

In the above-described conventional fixture 41, since a pressure is directly applied to the loaded board 11, it has been greatly feared that the loaded board 11 may suffer damage.

Moreover, the conventional fixture 51 has drawn the loaded board 11 to the top plate 54 by making the closed space made between the fixture 51 and the loaded board 11 vacuum. However, attraction by vacuum is directly applied to the loaded board 11, hence it has also been feared that the loaded board 11 may suffer damage.

Furthermore, in general, the loaded board 11 has some warp due to heat at the time of mounting devices 12, or the connection terminals 13 of the loaded board 11 are uneven due to manufacturing variation. However, as the spring probe pins 52, the ones having a constant stroke are used. For this reason, in order to secure the connection between the connection terminals 13 and the spring probe pins 52, the loaded board 11 has been required to be pressed to the spring probe pins 52 so as to absorb the warp of the loaded board 11 or the unevenness of the connection terminals 13.

Accordingly, a force more than necessary is applied to the loaded board 11 depending on the connection terminals 13 of the loaded board 11, as well as it is connected to the spring probe pins 52, hence the connection terminals 13 receive a excessive load from the spring probe pins 42 or 52. As such, in the conventional fixtures 41 and 51, a force more than necessary is applied to the loaded board 11 depending on the connection terminals 13 of the loaded board 11. As a result, it has been feared that the warp of the loaded board 11 may occur.

Heretofore, such warp occurred due to the load of the spring probe pins 42 or 52 has been able to be neglected to some extent. However, in such a case like a bear chip loaded board before resin sealing, which has been used in recent years, since bear chip connection terminals are damaged due to the warp of the board, such warp are not being able to be neglected.

SUMMARY OF THE INVENTION

The object of the present invention, in consideration of the foregoing problems, when a test fixture is connected electrically to a loaded board, to provide a test fixture capable of performing secure electrical connection without using spring probe pins or applying an excessive load to connection terminals of the loaded board.

In order to solve the foregoing subjects, a test fixture of the present invention includes a plurality of sleeves, and a plurality of probe pins, each is arranged slidable within a corresponding sleeve and making electrical contact with the sleeve; and an air source connected to the plurality of sleeves, wherein the probe pins are slidable by an air pressure from the air source to electrically connect to connection terminals of a loaded board positioned on the test fixture.

Moreover, the test fixture further includes a base with supports for the loaded board and a top plate in which the sleeves are arranged, wherein the probe pins are slidable by an air pressure generated by injecting air into a space, which is formed by the base, the top plate, the sleeves and the probe pins.

BRIEF DESCRIPTION OF THE DRAWINGS

The above and other objects, features and advantages of the present invention will become more apparent upon a reading of the following detailed description taken in conjunction with the accompanying drawings, in which.

DESCRIPTION OF THE PREFERRED EMBODIMENTS

Figure 1:
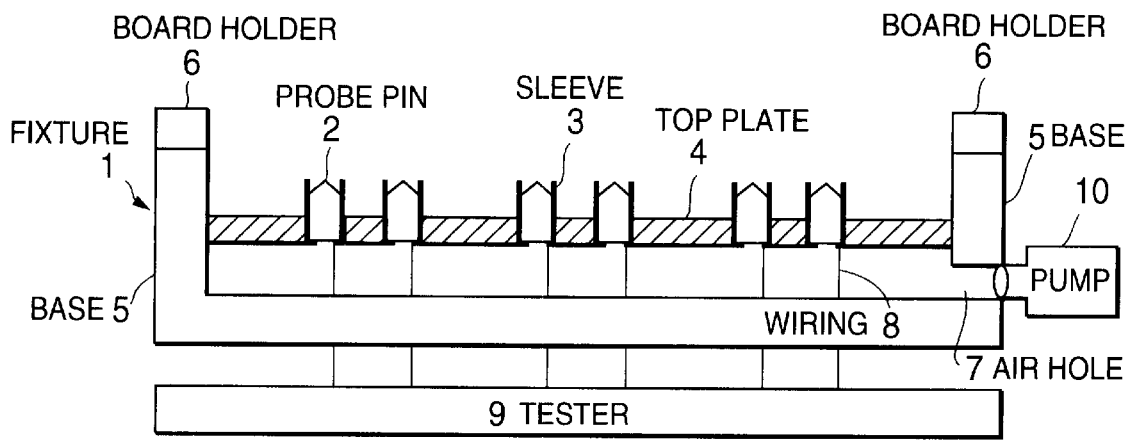
FIG. 1 is a view showing the constitution of the first embodiment of the test fixture of the present invention.

Referring to FIG. 1, a fixture 1 of the present invention includes probe pins 2, sleeves 3 in which the probe pins 2 can move vertically, a top plate 4, a base 5, board holders 6 and an air hole 7 used as an air gateway.

The probe pins 2 and the sleeves 3 are comprised of a conductive material, and the sleeves 3 are fixed into the top plate 4. The probe pins 2 are arranged in the sleeves 3 of the top plate 4, and are vertically slidable inside the sleeves 3 in an electrically connected state therebetween. A pump 10 is connected to the air hole 7. The pump 10 performs air injection and evacuation relative to a space inside the fixture 1, which is surrounded by the probe pins 2, the top plate 4 and the base 5. Moreover, wirings 8 are connected to the sleeves 3 with the probe pins 2 respectively arranged therein, and make an electrical connection between the probe pins 2 and a tester 9.

In the present invention, when connection is performed between the loaded board 11 and the fixture 1 air pressure is used to bias the pins against the board.

Figure 2:
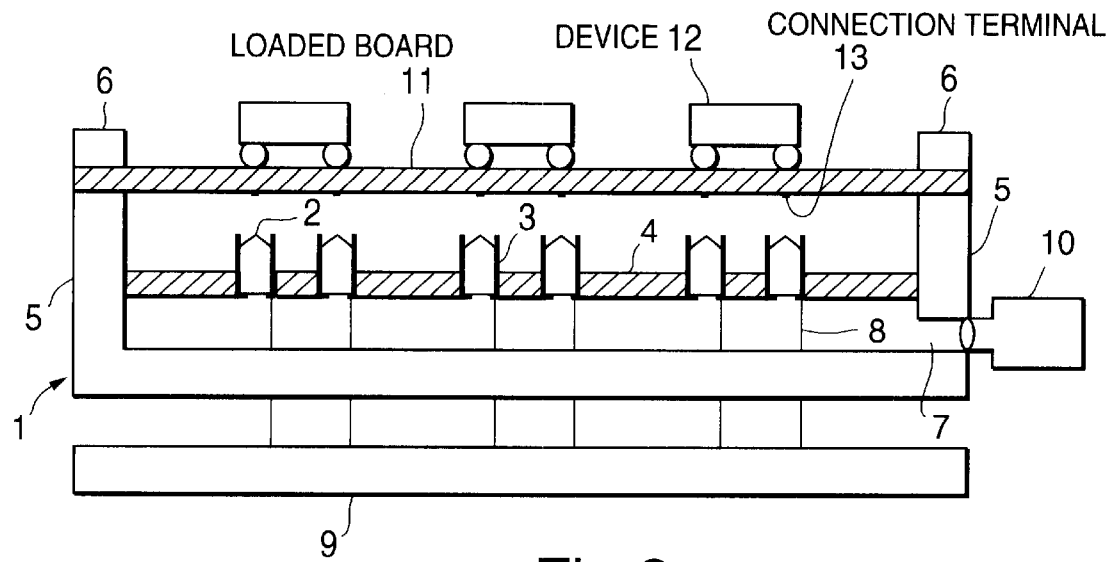
FIG. 2 is a view showing the state before the air is injected in the first embodiment.
Figure 3:
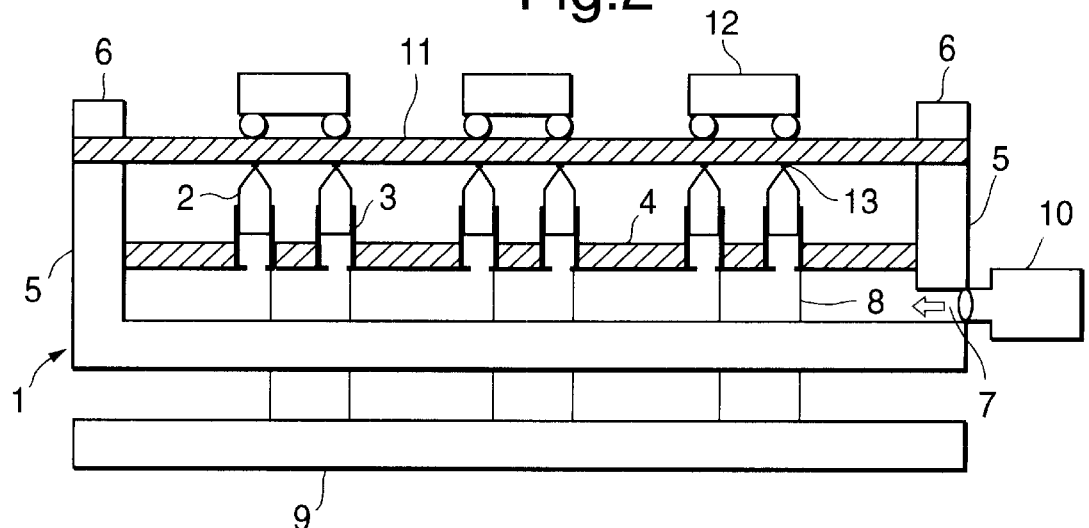
FIG. 3 is a view showing the state after the air is injected.
Figure 4:
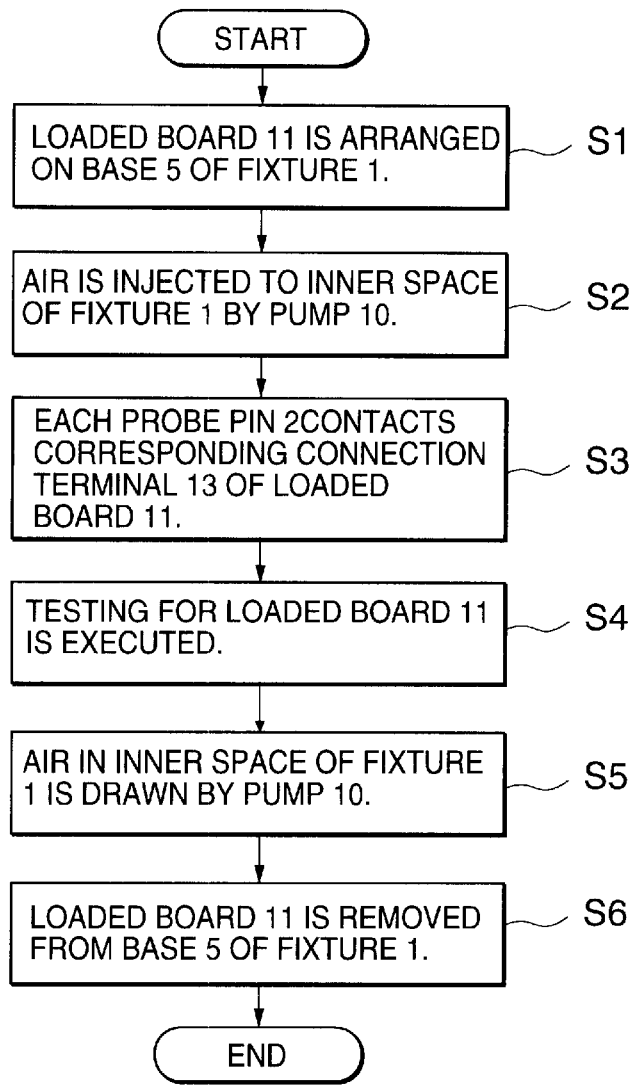
FIG. 4 is a flowchart explaining the operation.

Referring to FIGS. 2 to 4, the loaded board 11 with devices 12 mounted thereon is arranged on the base 5 of the fixture 1 and held by board holders 6 (S1 of FIG. 4). At this time, the probe pins 2 sink to the lower end of the sleeves 3. Therefore, there is a space between the connection terminals 13 of the loaded board 11 and the probe pins 2, hence they do to not contact each other.

In the fixture 1, there exists an inner space, which is surrounded by the probe pins 2, the sleeves 3, the top plate 4 and the base 5. When the loaded board 11 is arranged on the base 5, air is injected through the air hole 7 to the inner space of the fixture 1 by the pump 10 (S2 of FIG. 4). The inner space of the fixture 1 is not separated independently for each pin of the probe pins 2, but is a single space where air is entirely communicated. As the air is sent from the air hole 7 by the pump 10, the air pressure in the inner space of the fixture 1 is gradually elevated. When the air pressure in the inner space of the fixture 1 is increased, each probe pin 2 is pushed upward inside the sleeves 3 by the air pressure. Referring to FIG. 3, each probe pin 2 goes up inside the sleeve 3, and in a short time, contacts the corresponding connection terminal 13 of the loaded board 11, which is located above the probe pin 2 to stop (S3 of FIG. 4). Thus, each connection terminal 13 of the loaded board 11 is electrically connected to the tester 9 through the corresponding probe pin 2, sleeve 3 and wiring 8. When all of the probe pins 2 respectively contact the corresponding connection terminals 13, testing is performed for the loaded board 11 with the tester 9 while the contacting state is maintained (S4 of FIG. 4).

When the testing is completed, the air in the inner space of the fixture 1 is withdrawn through the air hole 7 by the pump 10, the pressure in the inner space of the fixture 1 is returned to its initial value (S5 of FIG. 4). Thus, the probe pins 2 move to the lower ends of the sleeves 3, and the electrical connection with the connection terminals 13 is released. It is satisfactory that the loaded board 11 may be removed from the base 5 at the timing when the pressure in the inner space of the fixture 1 is lowered (S6 of FIG. 4).

Each probe pin 2 is pushed upward by the air pressure in a required distance corresponding to the one between the loaded board 11 and the connection terminal 13. For this reason, each probe pin 2 contacts the connection terminal 13 without an excessive force being applied thereto, and a warp does not occur in regard to the loaded board 11. Moreover, there is no limitation on a stroke of the probe pins, as in the case where the conventional spring probe pins are used. For this reason, although there may exist a distance variation between the probe pins 2 and the connection terminals 13 due to the transformation of the loaded board 11 and the like, the probe pins 2 and the connection terminals 13 can easily connect to each other without an excessive pressure being applied therebetween.

Figure 5:
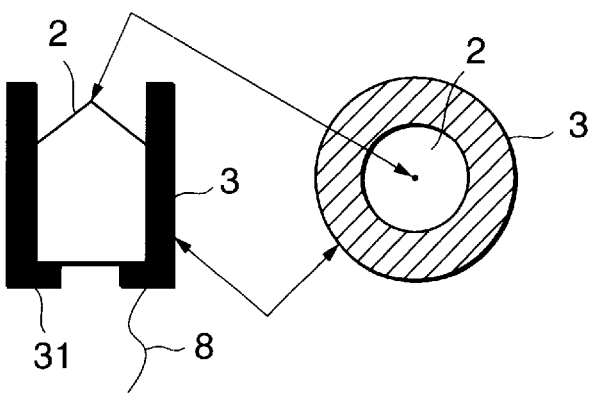
FIG. 5 is a cross-sectional and top elevation views showing the constitutions of the probe pin and the sleeve.
Figure 6:
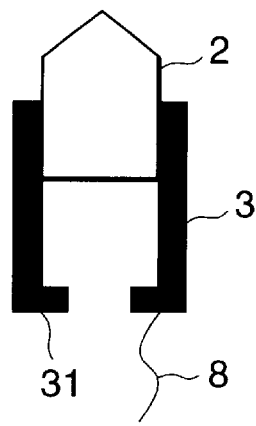
FIG. 6 is a cross-sectional view showing the constitutions of the probe pin and the sleeve.

Constitutions of the probe pins 2 and the sleeves 3 will be described. Referring to FIGS. 5 and 6, each sleeve 3 is formed to be cylindrical, and an inside thereof is hollow. Also, on the lower surface side inside the sleeve 3, latching members 31 such as hooks are provided. Furthermore, the sleeve 3 is connected through the wiring 8 to the tester 9. The probe pin 2 is arranged inside the sleeve 3, supported by the latching members 31 of the sleeve 3, and held inside the sleeve 3 without falling from the sleeve 3. When the pressure in the inner space of the fixture 1 is elevated, as shown in FIG. 6, the probe pin 2 receives a pressure from the lower surface to the upper direction to go up inside the sleeve 3. Both the probe pin 2 and the sleeve 3 are made of a conductive material, and are always electrically connected to each other. Accordingly, the probe pin 2 is always connected to the tester 9 through the sleeve 3 and the wiring 8.

Figure 7:
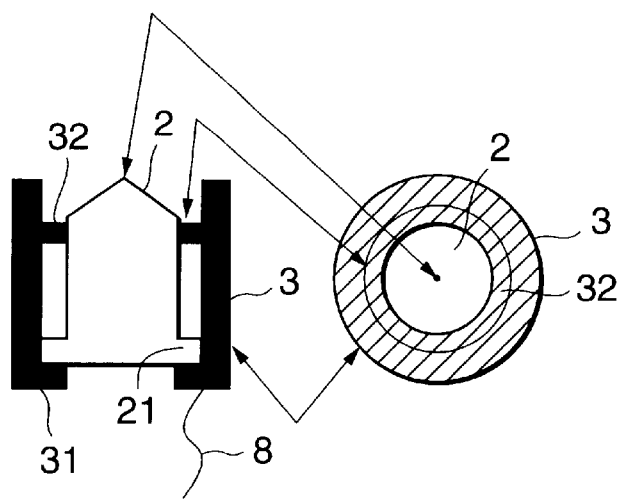
FIG. 7 is a cross-sectional and top elevation views showing the constitutions of the probe pin and the sleeve.
Figure 8:
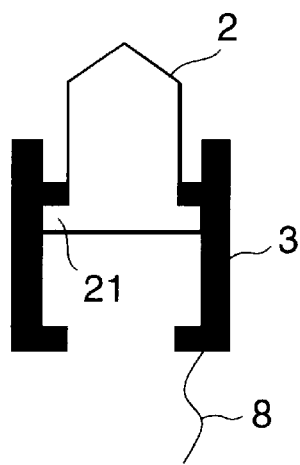
FIG. 8 is a cross-sectional view showing the constitutions of the probe pin and the sleeve.

Moreover, referring to FIGS. 7 and 8, a constitution may be adopted such that a first latching member 31 is provided in the lower surface side and a second latching member 32 is provided in the upper surface side respectively inside of the sleeve 3, and further, a part of the probe pin 2 is protruded to provide a protrusion 21. In this case, a range where the probe pin 2 can slide inside the sleeve 3 is equal to an interval between the first latching member 31 and the second latching member 32 of the sleeve 3. With such a constitution, falling-off of the probe pin 2 from the sleeve 3 due to the pressure received from the inner space of the fixture 1 can be securely prevented.

Figure 9:
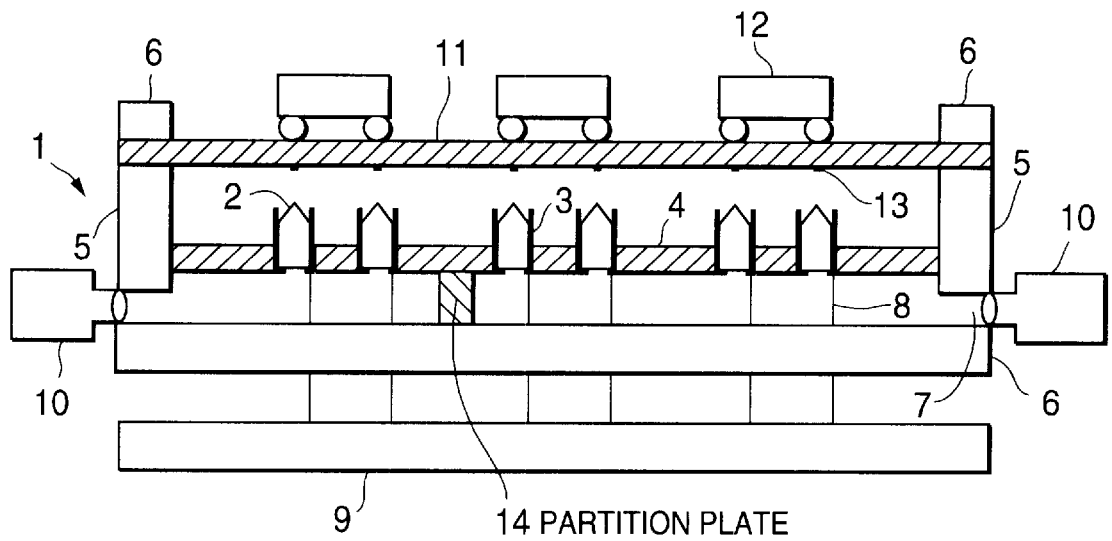
FIG. 9 is a view showing the constitution of the second embodiment of the test fixture.
Figure 10:
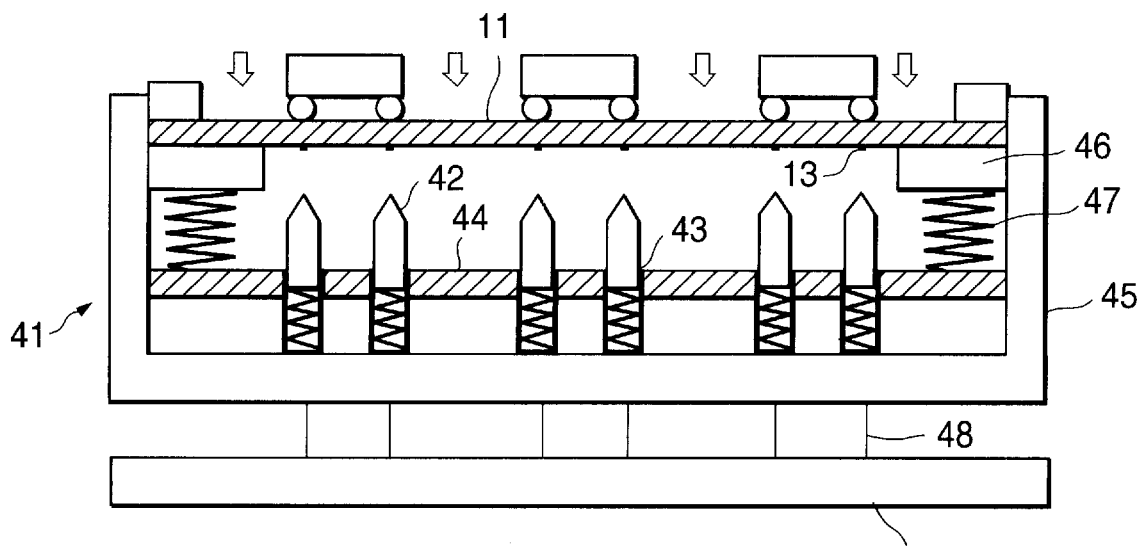
FIG. 10 is a view showing the constitution of the conventional test fixture.
Figure 11:
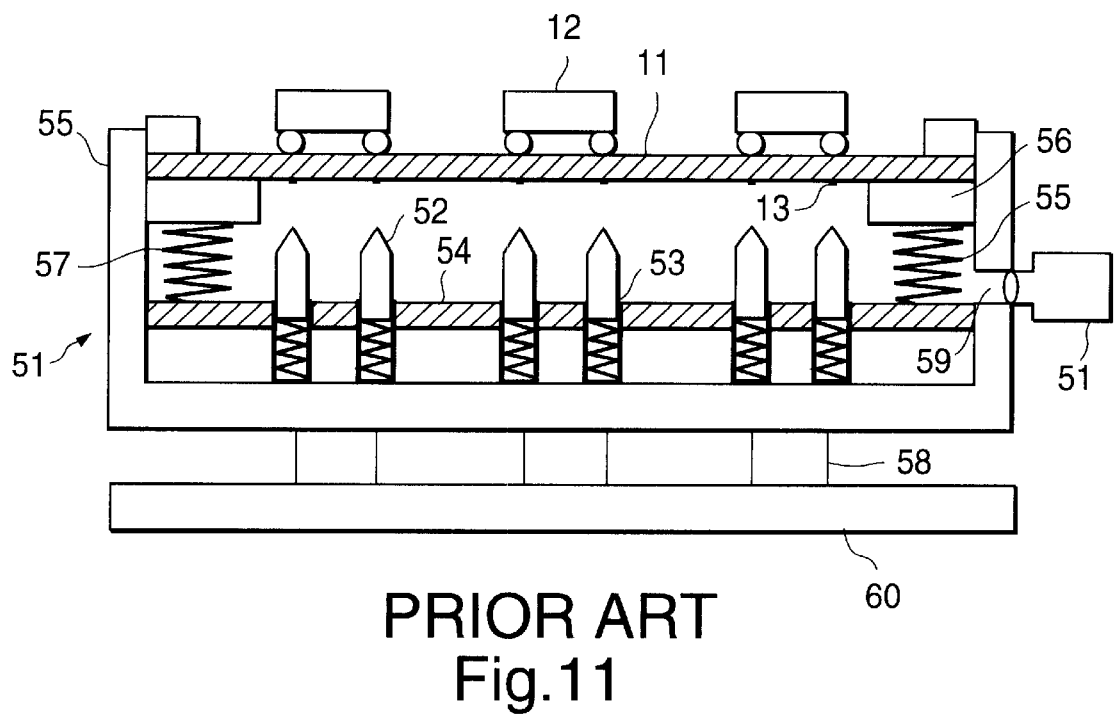
FIG. 11 is a view showing the constitution of another conventional test fixture.
Figure 12:
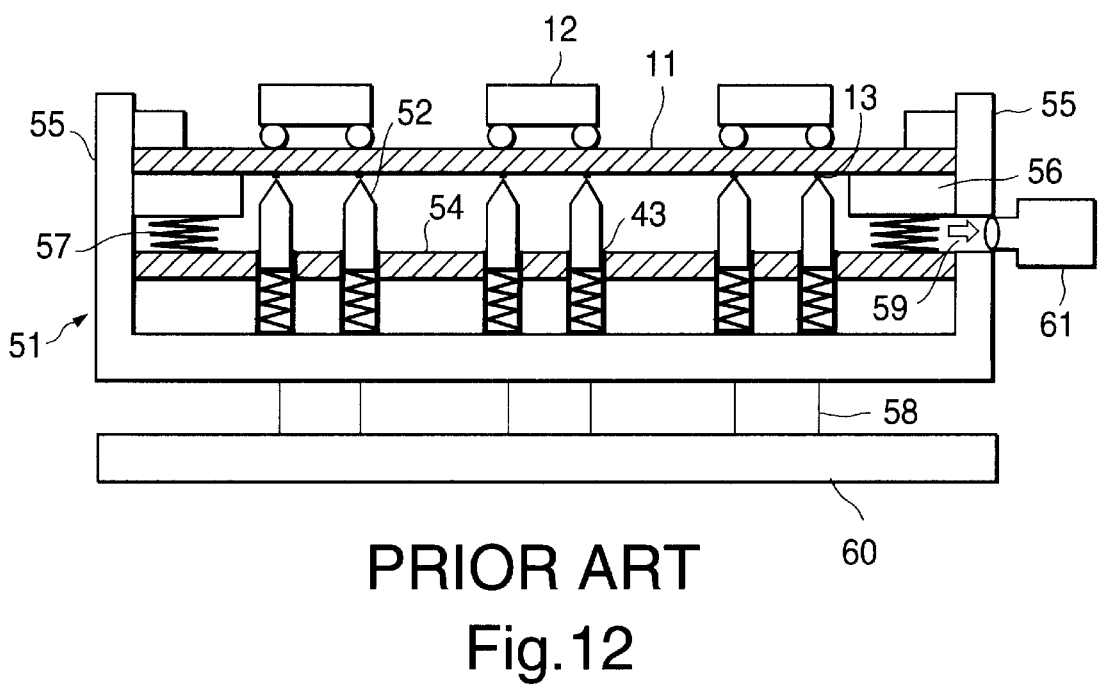
FIG. 12 is a view showing the state of another conventional test fixture after the air is sucked.

A second embodiment of the present invention will be described. Referring to FIG. 9, the second embodiment of the present invention has a partition plate 14 which partitions the inside of the fixture 1 for each of certain sections. The air hole 7 is provided for each partitioned section, and the pump 10 is arranged for each air hole 7. With such a constitution, the pressures to the connection terminals 13 can be individually adjusted so as to meet the characteristic and condition of the loaded board 11.

As described above, the fixture 1 of the present invention has a constitution such that the probe pins 2 are arranged so as to be able to slide inside the sleeve 3, and the probe pins 2 are pushed upward by elevating the pressure in the inner space of the fixture 1. Thus, without directly applying a pressure to the loaded board 11, the fixture 1 and the loaded board 11 can be electrically connected to each other, and occurrence of the warp in regard to the loaded board 11 can be prevented.

As apparent from the foregoing descriptions, since all of the probe pins are pressed to the loaded board 11 well-balanced by the air pressure in the inner space of the fixture 1, the warp can be prevented without giving an excessive force to the loaded board 11.

Moreover, although there exists transformation due to the warp and the like of the loaded board 11, contact of the probe pins 2 can be securely performed. The reason is that since the probe pins 2 are pushed upward by the air pressure, strokes of the individual probe pins 2 are adjusted, and variation of the distances between the loaded board 11 and the respective probe pins 2 can be absorbed.

Although the preferred embodiments of the present invention have been described in detail, it should be understood that various changes, substitutions and alternations could be made therein without departing from spirit and scope of the inventions as defined by the appended claims.

What is claimed is:

1. A test fixture for testing a loaded board, comprising:
   a plurality of sleeves;
   a plurality of probe pins, each of said probe pins being arranged slidably within a corresponding one of said sleeves and making electrical contact with the corresponding one of said sleeves;
   a base with supports for supporting a loaded board;
   a top plate in which said sleeves are arranged, said base and top plate forming an enclosed space; and
   an air hole through said base,
   wherein said probe pins are pushed into electrical connection with connection terminals of a loaded board positioned on the test fixture by air pressure generated by injecting air through said air hole into the space.

2. The test fixture according to claim 1, wherein said space is formed by being surrounded by said base, said top plate, said sleeves and said probe pins.

3. The test fixture according to claim 1, further comprising a pump arranged to inject air through said air hole into the space for sliding said probe pins.

4. The test fixture according to claim 1, further comprising:
   a partition plate arranged to partition the space into a plurality of sections; and
   each of said sections having a respective said air hole which allows air into and out of the respective one of said sections.

5. The test fixture according to claim 1, wherein each of said sleeves has a cylindrical shape and includes a latching member arranged to latch the corresponding one of said probe pins in a lower inside thereof.

6. The test fixture according to claim 1, wherein each of said sleeves has a cylindrical shape and includes first and second latching members respectively arranged to latch the corresponding one of said probe pins in upper and lower insides thereof, and
   wherein each of said probe pins has a protrusion located between said first and second latching members.

7. A circuit board tester comprising:
   a base with supports for supporting a circuit board;
   a plate in said base, wherein an interior of said base and a bottom of said plate define an enclosed space;
   plural probe pins slideably mounted in said plate and having ends at the bottom of said plate that are exposed to said enclosed space, wherein said plural probe pins are arranged and adapted to slide into electrical contact with respective terminals on a circuit board supported on said base; and
   an air pump that injects air into said enclosed space to create air pressure in said enclosed space that urges said plural probe pins away from said enclosed space and into electrical contact with respective terminals on a circuit board supported on said base.

8. The tester of claim 7, further comprising plural electrically conductive sleeves, each of said sleeves slideably mounting a respective one of said plural probe pins and being in electrical contact therewith.

\* \* \* \* \*